United States Patent
Mansky et al.

(10) Patent No.: US 11,137,863 B2
(45) Date of Patent: Oct. 5, 2021

(54) SILVER NANOSTRUCTURE-BASED OPTICAL STACKS AND TOUCH SENSORS WITH UV PROTECTION

(71) Applicant: Cambrios Film Solutions Corporation, Tortola (VG)

(72) Inventors: Paul Mansky, San Francisco, CA (US); Pierre-Marc Allemand, San Jose, CA (US)

(73) Assignee: Cambrios Film Solutions Corporation, Tortola (VG)

(*) Notice: Subject to any disclaimer, the term of this patent is extended or adjusted under 35 U.S.C. 154(b) by 0 days.

(21) Appl. No.: 16/854,814

(22) Filed: Apr. 21, 2020

(65) Prior Publication Data

US 2020/0249381 A1 Aug. 6, 2020

Related U.S. Application Data

(62) Division of application No. 15/682,528, filed on Aug. 21, 2017, now Pat. No. 10,627,554, which is a division of application No. 14/460,999, filed on Aug. 15, 2014, now Pat. No. 9,759,846.

(60) Provisional application No. 61/883,863, filed on Sep. 27, 2013.

(51) Int. Cl.
*H01H 13/70* (2006.01)
*G06F 3/044* (2006.01)
*G01R 27/00* (2006.01)
*G01R 27/26* (2006.01)
*G02B 5/20* (2006.01)
*H03K 17/96* (2006.01)

(52) U.S. Cl.
CPC ........... *G06F 3/0445* (2019.05); *G01R 27/00* (2013.01); *G01R 27/2605* (2013.01); *G02B 5/208* (2013.01); *H03K 17/9618* (2013.01); *H03K 2017/9613* (2013.01); *H03K 2217/96015* (2013.01)

(58) Field of Classification Search
CPC ...... G06F 3/0445; G06G 3/044; G01R 27/00; G01R 27/2605; G02B 5/208; H03K 17/9618; H03K 17/9613; H03K 2217/96015
See application file for complete search history.

(56) References Cited

U.S. PATENT DOCUMENTS

2014/0202742 A1* 7/2014 Jones ................. B23K 26/0006
174/253

* cited by examiner

*Primary Examiner* — Dale E Page
*Assistant Examiner* — Colleen E Snow
(74) *Attorney, Agent, or Firm* — Cooper Legal Group, LLC

(57) ABSTRACT

Disclosed herein are optical stacks that are stable to light exposure by incorporating one or more UV-blocking layers.

20 Claims, 10 Drawing Sheets

SILVER NANOSTRUCTURE-BASED OPTICAL STACKS AND TOUCH SENSORS WITH UV PROTECTION

CROSS-REFERENCE TO RELATED APPLICATION

This application claims the benefit of U.S. Provisional Patent Application No. 61/883,863, filed Sep. 27, 2013, U.S. patent application Ser. No. 14/460,999, filed Aug. 15, 2014, and U.S. patent application Ser. No. 15/682,528, filed on Aug. 21, 2017. U.S. Provisional Patent Application No. 61/883,863, U.S. patent application Ser. No. 14/460,999, and U.S. patent application Ser. No. 15/682,528 are incorporated herein by reference in their entireties.

BACKGROUND

Technical Field

The disclosure relates to manufacturing stable and reliable optical stacks comprising at least one transparent conductive film of silver nanostructures.

Description of the Related Art

Transparent conductors refer to thin conductive films coated on high-transmittance surfaces or substrates. Transparent conductors may be manufactured to have surface conductivity while maintaining reasonable optical transparency. Such surface conducting transparent conductors are widely used as transparent electrodes in flat liquid crystal displays, touch panels, electroluminescent devices, and thin film photovoltaic cells; as anti-static layers; and as electromagnetic wave shielding layers.

Currently, vacuum deposited metal oxides, such as indium tin oxide (ITO), are the industry standard materials for providing optical transparency and electrical conductivity to dielectric surfaces such as glass and polymeric films. However, metal oxide films are fragile and prone to damage during bending or other physical stresses. They also require elevated deposition temperatures and/or high annealing temperatures to achieve high conductivity levels. For certain substrates that are prone to adsorbing moisture, such as plastic and organic substrates (e.g., polycarbonates), it becomes problematic for a metal oxide film to adhere properly. Applications of metal oxide films on flexible substrates are therefore severely limited. In addition, vacuum deposition is a costly process and requires specialized equipment. Moreover, the process of vacuum deposition is not conducive to forming patterns and circuits. This typically results in the need for expensive patterning processes such as photolithography.

In recent years there is a trend to replace current industry standard transparent conductive ITO films in flat panel displays with a composite material of metal nanostructures (e.g., silver nanowires) embedded in an insulating matrix. Typically, a transparent conductive film is formed by first coating on a substrate an ink composition including silver nanowires and a binder. The binder provides the insulating matrix. The resulting transparent conductive film has a sheet resistance comparable or superior to that of the ITO films.

Nanostructure-based coating technologies are particularly suited for printed electronics. Using a solution-based format, printed electronic technology makes it possible to produce robust electronics on large-area, flexible substrates or rigid substrates (glass). See U.S. Pat. No. 8,049,333, in the name of Cambrios Technologies Corporation, which is hereby incorporated by reference in its entirety. The solution-based approach to forming nanostructure-based thin film is also compatible with existing coating and lamination techniques. Thus, additional thin films of overcoat, undercoat, adhesive layer, and/or protective layer can be integrated into a high through-put process for forming optical stacks that include nanostructure-based transparent conductors.

Although generally considered as a noble metal, silver can be sensitive to corrosion under specific circumstances. One result of silver corrosion is a loss of conductivity either locally or uniformly, which manifests as drifts in sheet resistance of the transparent conductive film, leading to an unreliable performance. Accordingly, there remains a need in the art to provide reliable and stable optical stacks incorporating nanostructure-based transparent conductors.

BRIEF SUMMARY

Disclosed are optical stacks including silver nanostructure-based optical stacks that are stable to prolonged light exposure by incorporating one or more UV-blocking layers.

One embodiment provides a touch sensor comprising:
a first basic transparent conductor having a first substrate and a first plurality of networking silver nanostructures;
an OCA layer,
a second basic transparent conductor having a second substrate and a second plurality of networking silver nanostructures;
and a third substrate,
wherein the third substrate has a surface that receives incident light and touch input, the second basic transparent conductor is more proximate to the incident light than the first basic transparent conductor, and
wherein at least one of the second substrate, the third substrate or the OCA layer is a UV-blocking layer.

A further embodiment provides a touch screen comprising:
a first basic transparent conductor having a first substrate and a first plurality of networking silver nanostructures formed on the first substrate;
an OCA layer, and
a second transparent conductor having a second substrate and a continuous conductive film formed on the second substrate;
wherein the second substrate has a surface that receives incident light and touch input, the second transparent conductor is more proximate to the incident light than the first basic transparent conductor, and
wherein at least one of the second substrate or the OCA layer is a UV-blocking layer.

Yet another embodiment provides an optical stack comprising:
a basic transparent conductor having a substrate and a plurality of networking silver nanostructures; and
a UV-blocking layer.

Yet a further embodiment provides an optical stack comprising:
a basic transparent conductor having a first substrate and a plurality of networking silver nanostructures; and
a second substrate overlying the basic transparent conductor,
wherein the second substrate is coated with an UV-blocking coating.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION

Transparent conductive films are essential components in flat panel display devices such as a touch screen or a liquid crystal display (LCD). The reliability of these devices is dictated in part by the stability of the transparent conductive films, which are exposed to light and heat under the devices' normal operating conditions. As discussed herein in more detail, it is discovered that prolonged light exposure may induce corrosion of silver nanostructures, causing localized or uniform increase in sheet resistance of the transparent conductor. Thus, disclosed are optical stacks including silver nanostructure-based transparent conductors or thin films that are stable to prolonged heat and light exposure and methods for preparing the same.

As used herein, "optical stack" refers to a multi-layer structure or panel that is generally placed in a light path of an electronic device (e.g., a touch sensor or flat panel display). The optical stack includes at least one layer of a metal nanostructure-based transparent conductive film (or transparent conductor). Other layers of the optical stack may include, for example, a substrate, an overcoat, an undercoat, an adhesive layer, a protective layer (e.g., cover glass) or other performance-enhancing layers such as anti-reflective or anti-glare films. Preferably, the optical stack includes at least one layer of optically clear adhesive (OCA).

Figure 1:
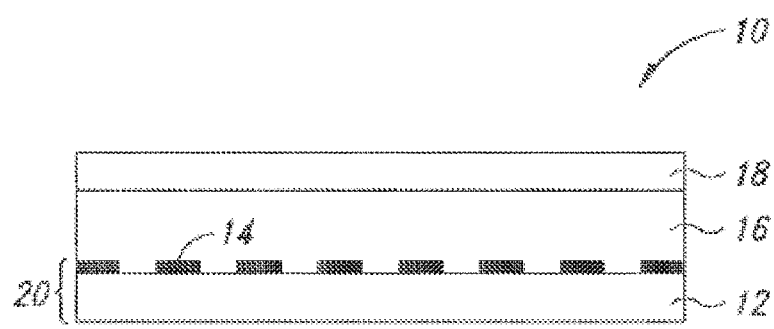
FIG. 1 shows an optical stack including a basic transparent conductor of silver nanostructures.

Optical stacks may take many configurations. FIG. 1 shows one of the simplest constructions. As shown, an optical stack (10) includes, from bottom up, a first substrate (12), a plurality of networking silver nanostructures (14), an OCA layer (16) and a second substrate (18). The optical stack (10) may be formed by first forming a basic transparent conductor (20) by depositing on the first substrate (12) a coating solution of silver nanostructures, a binder and a volatile solvent. After drying and/or curing, the silver nanostructures are immobilized on the first substrate (12). The first substrate may be a flexible substrate, e.g., a polyethylene terephthalate (PET) film.

This basic transparent conductor may be incorporated at versatile locations within an optical stack. An example of the basic transparent conductor (20) is commercially available under the trade name ClearOhm® by Cambrios Technologies Corporation, the assignee of the present application. The first substrate (12) may also be a rigid material such as glass. The basic transparent conductor (20) may be laminated to the second substrate (18) via an intermediate OCA layer (16). The second substrate (18) may be rigid (e.g., glass) or flexible (e.g., a protecting film). Such a panel can serve as, for example, a capacitive touch panel.

Photo-Oxidation

Figure 2A:
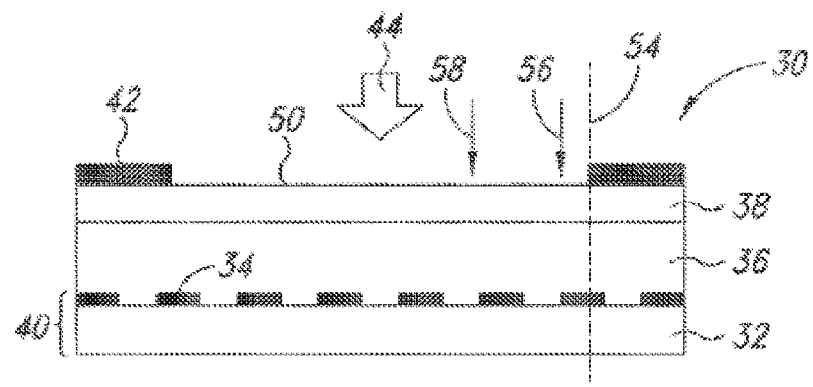
FIGS. 2A and 2B schematically show the "edge failure" mode of nanostructure corrosion.

The propensity for corrosion of the silver nanostructures in an optical stack upon light exposure may be attributed to a number of factors that operate in a complex manner. It is discovered that certain corrosion induced by light can be particularly pronounced at the interface of a dark region and an illuminated region exposed to ambient light or simulated light. FIG. 2A schematically shows this so-called "edge failure" in an optical stack (30), which may be viewed as a simplified mockup model for a touch sensor. More specifically, optical stack (30) includes a first substrate (32), a plurality of networking silver nanostructures (34) formed on the first substrate (32) to provide a basic transparent conductor (40), and an OCA layer (36), which bonds the basic transparent conductor (40) to a second substrate (38). A black-out mask (42) is placed along the periphery of the optical stack (30) to model the light/dark interface. In a real device, a light/dark interface is created by a decorative frame ("deco frame") or bezel, which is used to hide the signal routing traces. Full spectrum light (44), which is sunlight or light from a solar simulator, is directed to the top surface (50) of the optical stack (30). Surprisingly, it is observed that the nanostructures in the illuminated areas (56) closest to the interface or edge (54) between the black-out and the light exposure, can undergo degradation faster than the nanostructures at the illuminated area (58) farther away from the edge (54). The degradation manifests in a sharp increase in the sheet resistance localized near the edge (54).

Figure 2B:
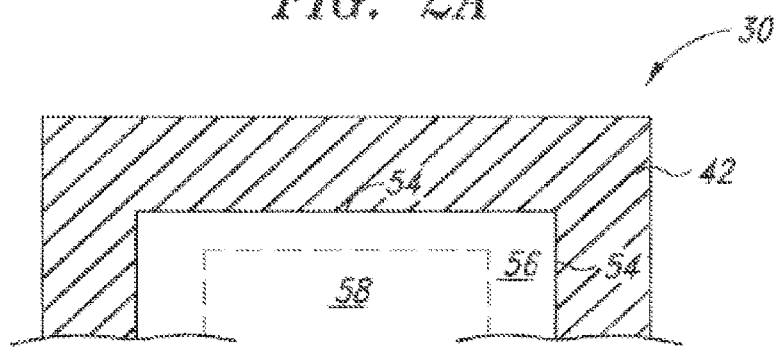

FIG. 2B shows the top view of the optical stack (30). The black-out mask (42) blocks the light from reaching the local, underlying nanostructures. The illuminated area (56) that is proximate to the mask (42) can experience more and faster nanostructure corrosion than the areas (58) farther away from the mask (e.g., the center of the touch sensor). Regardless of the failure mechanisms, it is discovered that certain photochemical activities cause corrosion of the silver nanostructures through an oxidation reaction:

Two factors, ultra violet (UV) light and the presence of oxygen in the optical stack, are found to promote the oxidation of silver nanowires. In addition, polymer-based substrates, such as PET, can also undergo photo-oxidation when exposed to the UV light, which consumes oxygen in the process. The photo-oxidation rate can also be strongly impacted by the chemicals in the other layers of the stack, particularly the OCA.

Edge-localized failure is believed to be a result of higher local levels of both oxygen and light in the area (56) closest to the light/dark interface (54), as compared to areas farther away (58). More specifically, in the illuminated areas, because the PET film substrate also undergoes photo-oxidation, the silver nanowires are deprived of oxygen due to the competing oxygen consumption by the PET substrate. However, oxygen can diffuse through the PET in the dark regions (under the mask), and then diffuse laterally through the OCA and into the illuminated area, where it is consumed in photooxidation reactions. Therefore the light/dark interface is the only part of the optical stack that is exposed to high levels of both oxygen and light.

It is also discovered that a close proximity to the OCA in some cases appears to induce and aggravate the corrosion of the silver nanostructures. Optically clear adhesives (OCA) are thin adhesive films often used to assemble or bond several functional layers (e.g., cover glass and transparent conductors) into an optical stack or panel (see FIG. 1). An OCA often contains mixtures of alkyl acrylates formed by free radical polymerization. As a result, the OCA may contain unreacted initiators or photo-initiators, residual monomers, solvents, and free radicals. Some of these species are photo-sensitive and can be harmful to the silver nanostructures in close proximity to the OCA. Chemicals from the OCA can also promote photo-oxidation reactions by participating in redox reactions downstream of the initial photooxidation step. As used herein, the OCA may be pre-made (including commercial forms) and laminated onto a substrate, or coated directly onto a substrate from a liquid form.

Photo-sensitive species readily absorb photons and undergo or induce complex photochemical activities. One type of photochemical activity involves excitation of a compound from a ground state to a higher energy level, i.e., an excited state. The excited state is transient and generally would decay back to the ground state with the release of heat. Yet it is also possible for the transient excited state to cause complex, cascading reactions with other species.

Incorporating the UV-Blocking Layer

An optical stack incorporating a UV-blocking layer is capable of blocking or attenuating the UV light from interacting with the silver nanostructures. The UV-blocking layer may be incorporated anywhere in an optical stack so long as it is placed between the light source and the nanostructures.

The UV-blocking layer comprises one or more UV-blocking substances which absorb photons in the UV region (typically defined as light below 390 nm), thus blocking or significantly attenuating the UV light in the incident light that could otherwise enter the optical stack and degrade the silver nanostructures. The UV-blocking substances are typically chemical compounds that have unsaturated chemical bonds. Generally, an electronic excited state is created when a UV-blocking substance absorbs a photon. The excited state returns to a ground state by energy transfer or electron transfer, thus dissipating the photon energy.

In certain embodiments, the UV-blocking layer may be any of the substrates described herein coated with a thin layer of UV-blocking substances. In other embodiments, the UV-blocking layer may incorporate the one or more UV-blocking substances within the bulk of the layer. In further embodiments, the UV-blocking layer may advantageously function as an OCA layer, particularly in the configurations in which the UV-blocking layer is an intermediate layer within an optical stack. In this case, the UV-blocking OCA layer serves the dual purpose of blocking the UV light as well as bonding two subparts of an optical stack.

Figure 3:
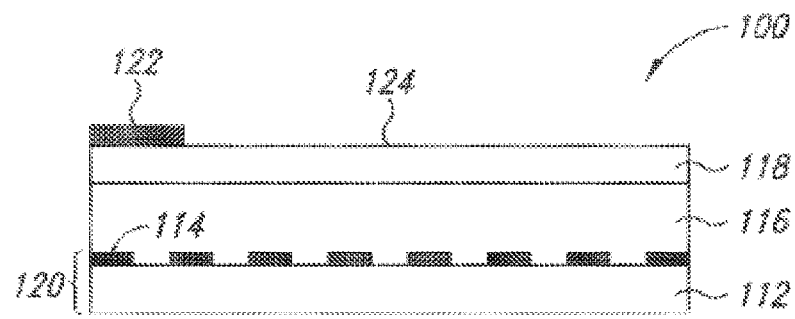
FIGS. 3-5 show optical stacks incorporating a UV-blocking layer according to various embodiments of the disclosure.

FIG. 3 illustrates an optical stack (100) incorporating a UV-blocking OCA layer. As shown, the optical stack (100) includes a first substrate (112), a plurality of networking silver nanostructures (114) formed on the first substrate (112) to provide a basic transparent conductor (120), a UV-blocking OCA layer (116) and a second substrate (118). A deco frame or black-out mask (122) may be optionally placed on the periphery of the surface (124) that incident light strikes. This configuration essentially replaces the OCA layer of the optical stack (30) of FIG. 2 with the UV-blocking OCA layer (116). Because the UV-blocking OCA layer contacts the nanostructures (114), it is important that the UV-blocking OCA be compatible with the nanostructures and does not become a source of destabilization.

Figure 4:
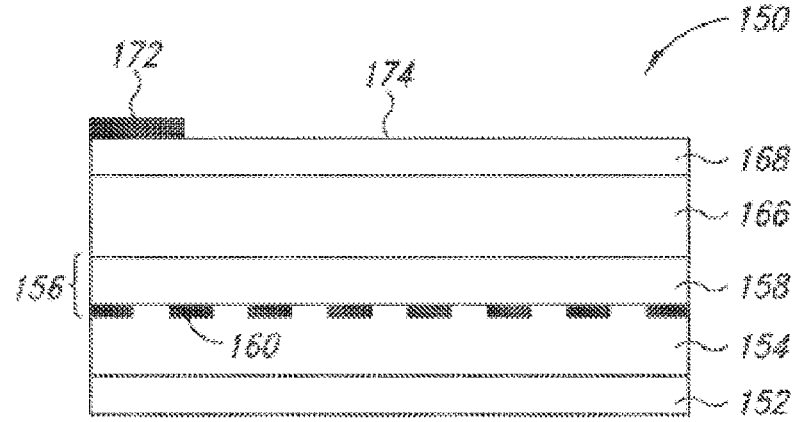

FIG. 4 illustrates another embodiment that can address the potential incompatibility between the UV-blocking layer and the silver nanostructures by inverting the orientation of the basic transparent conductor in an optical stack in relation to the incident light. As shown, an optical stack (150) includes, from bottom up, a first substrate (152), a first OCA layer (154), a basic transparent conductor (156) including a second substrate (158) and a plurality of networking silver nanostructures (160), a second OCA layer (166) and a third substrate (168), wherein the second OCA layer (166) is a UV-blocking layer, and the silver nanostructures (160) are not in contact with the second OCA layer. Deco frames or black-out tapes (172) may be optionally placed on the periphery of the surface (174) that incident light strikes. In this configuration, because the basic transparent conductor (156) is inverted as compared to the basic transparent conductor (120) in FIG. 3, the silver nanostructures do not come into direct contact with the UV-blocking OCA layer (166), thus avoiding any potential incompatibility between the UV-blocking substances and the silver nanostructures. The first OCA layer (154) needs not be a UV-blocking layer.

Figure 5:
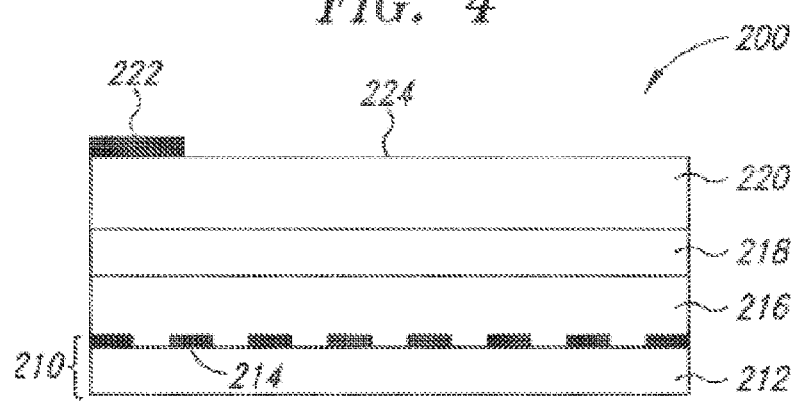

FIG. 5 shows a variant configuration from that of FIG. 4 according to another embodiment of this disclosure. As shown, an optical stack (200) includes, from bottom up, a basic transparent conductor (210) having a first substrate (212) and a plurality of networking silver nanostructures (214), an OCA layer (216), a second substrate (218) and a UV-blocking layer (220). The UV-blocking layer may be optionally covered by a deco frame or black-out mask (222) in its periphery on the surface (224) of the incident light. In FIG. 5, the silver nanostructures are not in contact with the UV-blocking layer, thus avoiding any potential incompatibility.

Figure 6:
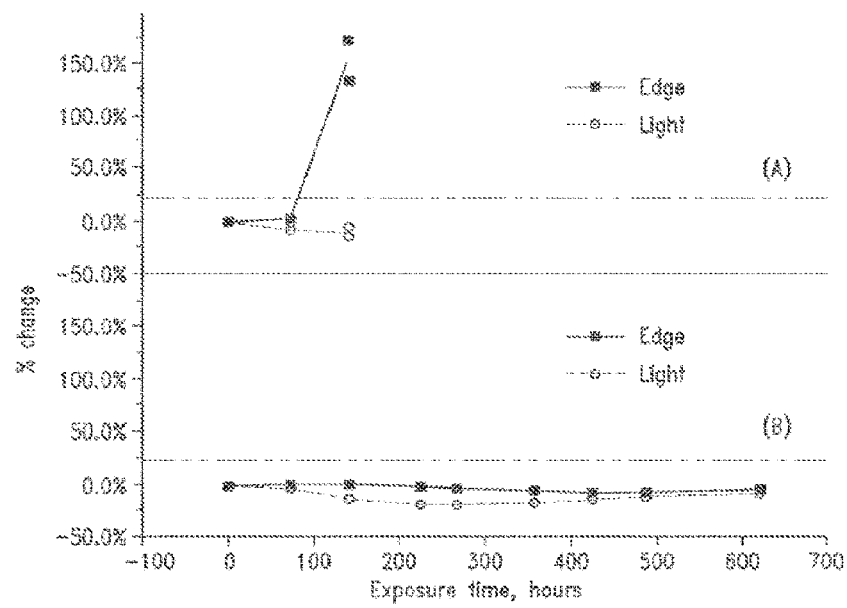
FIG. 6 shows that "edge failure" is effectively eliminated by incorporating a UV-blocking layer.

FIG. 6 shows the effects of the UV-blocking layer by exposing the optical stack (30) and optical stack (200) to a simulated light condition, as described herein and in further detail in Examples 3-4. Panel (A) corresponds to optical stack (30), which has no UV-blocking layer, A significant "edge failure" is shown, as indicated by the sharp increase of the apparent sheet resistance (measured by a non-contact eddy current method) of the optical stack in the edge region (56), whereas the sheet resistance of the optical stack in light area (58) farther away from the edge (54) is comparatively stable for more than 100 hours of light exposure. In contrast, optical stack (200), which incorporates a UV-blocking layer (220) shows the same stability over more than 600 hours of light exposure for the entire optical stack. As demonstrated, the UV-blocking layer is effective in preventing localized photodegradation.

Testing Photo-Stability

To test the photo-stability of the optical stack, sheet resistance of the optical stack under light exposure is measured as a function of time to detect any drift.

An ambient environmental chamber is used as a testing equipment that provides simulated light and ambient conditions in which the optical stack operates. Typically, a xenon arc lamp (e.g., Atlas XXL+) may be used as a solar simulator. The xenon arm lamp provides a full spectrum of light closely matching the sunlight. The intensity of the light may be adjusted to simulate direct sunlight or indirect diffuse sunlight at different times of the day or season. In addition, the environmental chamber may adjust for the temperature (including the chamber temperature and the back panel temperature), relative humidity and the like.

Touch Sensors

The UV-protected optical stacks described herein may be further integrated with other functional films to form a touch sensor.

For a touch sensor, whether it is capacitive or resistive, one or two transparent conductive films are employed to carry an electrical current underlying a touch surface. The transparent conductive films are patterned into conductive lines to detect the coordinates of the location of a touch input. When the touch surface is touched, a small change in the electrical voltage at the location of the touch input is detected (in a resistive touch sensor).

Many configurations are possible to construct touch sensors. In general, touch sensors can be classified by the different substrates, e.g., glass-based or film-based substrates that support the various functional layers. Earlier touch sensor architectures typically employ a GG configuration, i.e., glass-glass structure, each glass substrate supporting a respective transparent conductive film (e.g., an ITO layer). With the advent of the thin-film based transparent conductor, such as the ClearOhm® film by Cambrios Technologies Corporation, GFF (Glass-Film-Film) and GIF (Glass-Film) configurations are possible. Yet other configurations include PIT (Plastic-Film) by, Shoei Co., Ltd., and OFS (One-Film-Solution) by UniDisplay Inc.

Regardless of the configurations, as least one layer, e.g., a substrate, a cover layer, or an OCA layer, should be a UV-blocking layer positioned between the incident light and the silver nanostructures. When there are two silver nanostructure layers, the UV-blocking layer should be between the incident light and the silver nanostructure layer that is more proximate to the incident light, e.g., the second basic transparent conductor layers illustrated herein.

Various embodiments are directed to touch sensor architectures by incorporating the one or more UV-blocking layer, which provides light stability and protects the silver nanostructures from photodegradation. It should be understood that all of the configurations discussed herein may further include one or more anti-oxidants and/or one or more oxygen barrier as described in co-pending U.S. patent application Ser. No. 14/181,523, which application is incorporated herein in its entirety.

Figure 7:
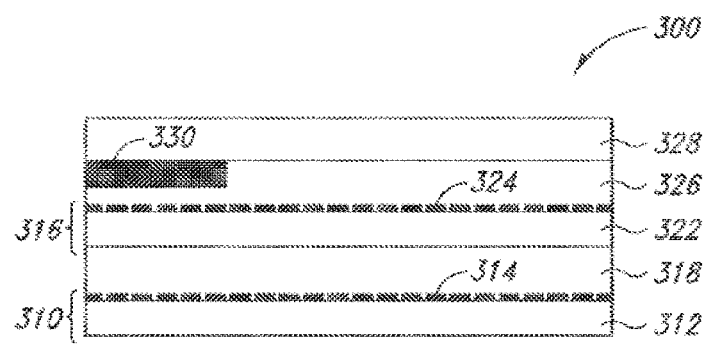
FIGS. 7-8 show touch sensors in GFF configurations.

FIG. 7 shows an exemplary GFF (glass-film-film) configuration according to one embodiment. As shown, a touch sensor (300) includes, from bottom up, a first basic transparent conductor (310) having a first substrate (312) and a first plurality of networking silver nanostructures (314) formed thereon. The first basic transparent conductor (310) is bonded to a second basic transparent conductor (316) via an OCA layer (318), a second basic transparent conductor (316) having a second substrate (322) and a second plurality of networking silver nanostructures (324) formed thereon. The first as well as the second basic transparent conductor may each be a ClearOhm® film. The second basic transparent conductor (316) is further bonded to, via a UV-blocking OCA layer (326), a third substrate (328). The third substrate may be a cover glass that receives the incident light as well as the touch input. An optional deco frame (330) may be incorporated underneath the cover glass (328). The UV-blocking OCA layer (326) effectively blocks the UV light of the incident light from entering the optical stack beyond the cover glass.

Figure 8:
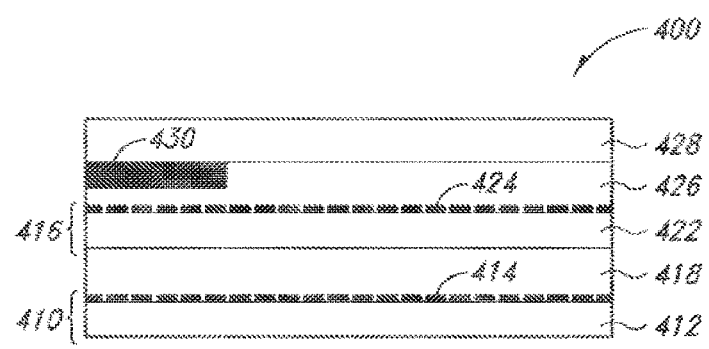

FIG. 8 shows a GFF/PFF (plastic-film-film) configuration according to another embodiment. As shown, a touch sensor (400) includes, from bottom up, a first basic transparent conductor (410) having a first substrate (412) and a first plurality of networking silver nanostructures (414) formed thereon. The first basic transparent conductor (410) is bonded to a second basic transparent conductor (416) via an OCA layer (418), the second basic transparent conductor (416) having a second substrate (422) and a second plurality of networking silver nanostructures (424) formed thereon. The first as well as the second basic transparent conductor may each be a ClearOhm® film. The second basic transparent conductor (416) is further bonded to, via an OCA layer (426), a third substrate (428), which is a UV-blocking cover lens (plastic or coated glass). An optional deco frame (430) may be incorporated underneath the UV-blocking cover lens (428). The UV-blocking cover lens (428) effectively blocks the UV light of the incident light from entering the touch sensor.

Figure 9:
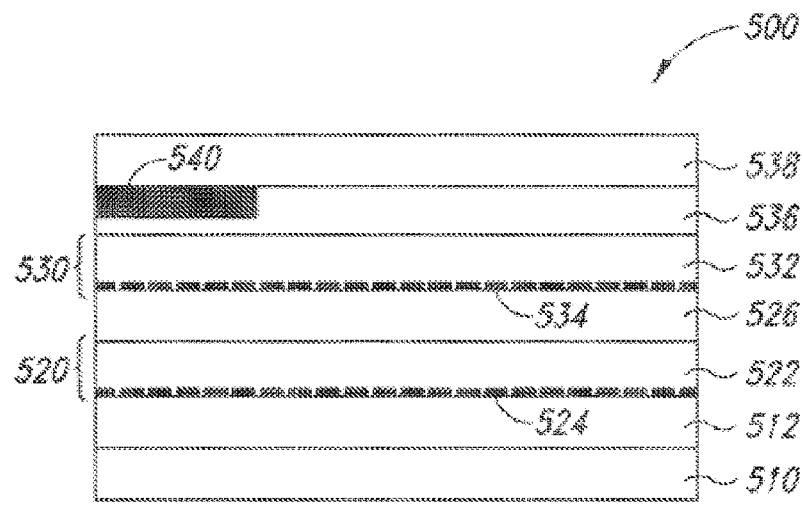
FIGS. 9-10 show touch sensors in inverted GFF configurations.

FIG. 9 shows a touch sensor in another GFF configuration, in which the basic transparent conductors are inverted as compared to those in FIG. 7. As shown, a touch sensor (500) includes, from bottom up, a cover film/display layer (510) bonded to, via a first OCA layer (512), a first basic transparent conductor layer (520) having a first substrate (522) and a first plurality of networking silver nanostructures (524) formed thereon. Compared to the first basic transparent conductor (310) of FIG. 7, the first basic transparent conductor (520) is inverted in that the first substrate (520) is more proximate to the incident light than the nanostructures (524). The first basic transparent conductor (520) is bonded to a second basic transparent conductor (530) via an OCA layer (526), the second basic transparent conductor (530) having a second substrate (532) and a second plurality of networking silver nanostructures (534) formed thereon. The first as well as the second basic transparent conductor may each be a ClearOhm® film. The second basic transparent conductor (530) is further bonded to, via a UV-blocking OCA layer (536), a third substrate (538). The third substrate (538) may be a cover glass that receives the incident light as well as the touch input. An optional deco frame (540) may be incorporated underneath the cover glass (538). The UV-blocking OCA layer (536) effectively blocks the UV light of the incident light from entering the optical stack beyond the cover glass. In addition, because the second basic transparent conductor is inverted, in that the second substrate (532) is more proximate to the incident light than the second plurality of nanostructures (534), the nanostructures (534) do not conic into direct contact with the UV-blocking OCA layer (536). As such, any potential incompatibility between the nanostructures and the UV-blocking OCA layer will not destabilize the touch sensor.

Figure 10:
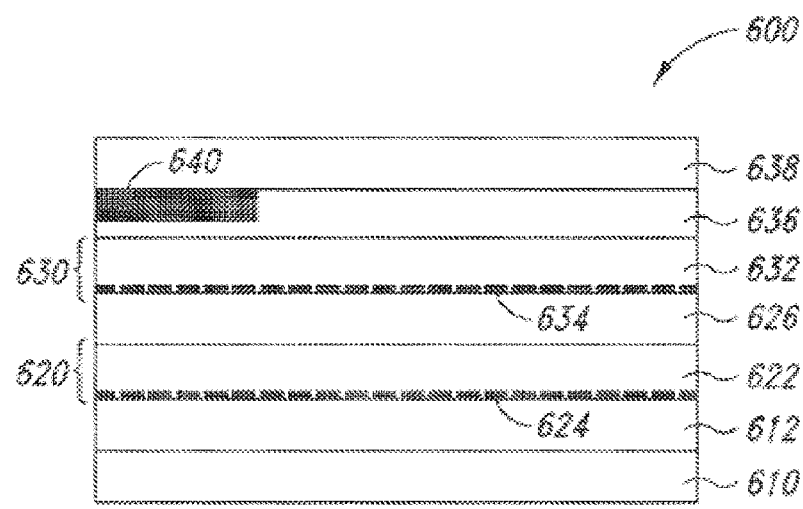

FIG. 10 shows a touch sensor in yet another GFF configuration, in which the basic transparent conductors are inverted. Touch sensor (600) resembles the touch sensor (500) of FIG. 9, except that the second basic transparent conductor (630) has a UV-blocking substrate. More specifically, touch sensor (600) includes, from bottom up, a cover film/display layer (610) bonded to, via a first OCA layer (612), a first basic transparent conductor layer (620) having a first substrate (622) and a first plurality of networking silver nanostructures (624) formed thereon, the first substrate (622) being more proximate to the incident light than the nanostructures (624). The first basic transparent conductor (620) is bonded to a second basic transparent conductor (630) via an OCA layer (626), the second basic transparent conductor (630) having a second UV-blocking substrate (632) and a second plurality of networking silver nanostructures (634) formed thereon. The first as well as the second basic transparent conductor may each be a ClearOhm® film. The UV-blocking substrate (632) may be any substrate coated with one or UV-blocking substances. The second basic transparent conductor (630) is further bonded, via an OCA layer (636), to a third substrate (638). An optional deco frame (640) may be incorporated underneath the cover glass (638). In this configuration, the inverted structure of the second basic transparent conductor (630) allows the UV-blocking substrate (632), which is between the incident light and the nanostructures (634), to block the UV light from interacting with the nanostructures.

Figure 11:
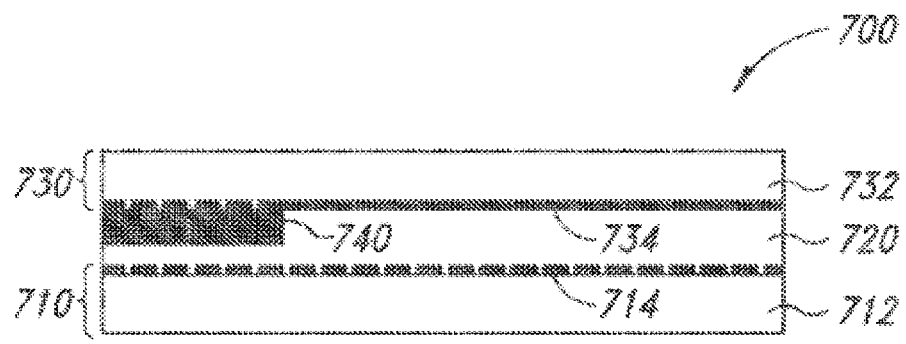
FIGS. 11-13 show touch sensors of additional configurations according to the various embodiments.

FIG. 11 shows a touch sensor in a GIF configuration. Touch sensor (700) comprises, from bottom up, a first basic transparent conductor layer (710) having a first substrate (712) and a first plurality of networking silver nanostructures (714) formed thereon. The first basic transparent conductor layer (710) may be a ClearOhm® film. It is bonded, via a UV-blocking OCA layer (720) to a glass-based transparent conductor (730) having a glass substrate (732) and a continuous conductive film (734), such as a layer of ITO film, formed thereon, the ITO film contacting the UV-blocking OCA layer (720). An optional deco frame (740) may be incorporated underneath the cover glass (732).

Figure 12:
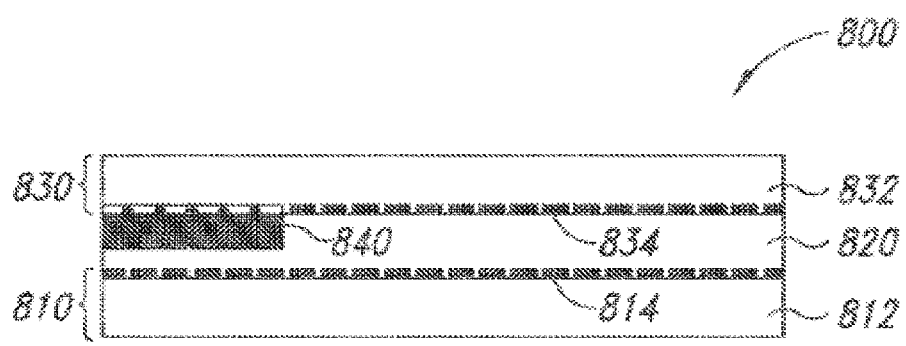

FIG. 12 shows a touch sensor in a PIF configuration, which employs a UV-blocking plastic cover lens. More specifically, a touch sensor (800) comprises, from bottom up, a first basic transparent conductor layer (810) having a first substrate (812) and a first plurality of networking silver nanostructures (814) formed thereon. The first basic transparent conductor layer (810) may be a ClearOhm® film. It is bonded, via an OCA layer (820), to a second basic transparent conductor (830) having a second UV-blocking substrate (832) and a second plurality of networking silver nanostructures (834) formed thereon. The second plurality of networking silver nanostructures (834) contact the OCA layer (820). The second UV-blocking substrate (832) may be a plastic cover lens that receives the incident light and touch input. An optional deco frame (840) may be incorporated underneath the cover lens (832).

Figure 13:
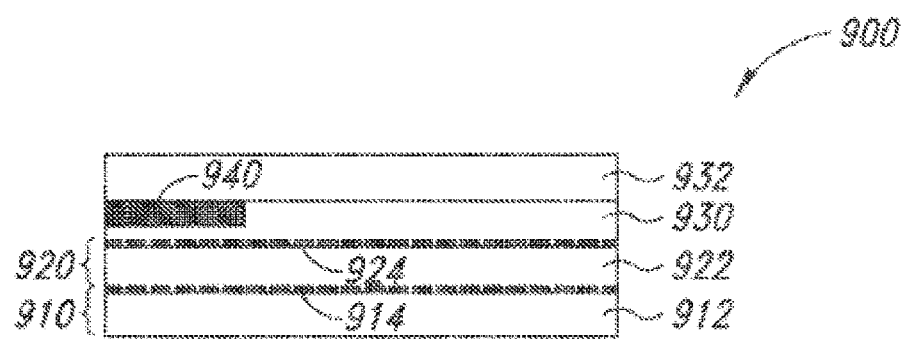

FIG. 13 shows a touch sensor in an OFS configuration, which employs a One-Film-Solution approach to fabricate two basic transparent conductors bonded directly to each other, without an intermediate OCA layer. A touch sensor (900) comprises, from bottom up, a first basic transparent conductor layer (910) having a first substrate (912) and a first plurality of networking silver nanostructures (914) formed thereon. The first basic transparent conductor layer (910) may be a ClearOhm® film. It is bonded directly to a second basic transparent conductor (920) having a second substrate (922) and a second plurality of nanostructures (924) formed thereon. The second substrate (922) acts as an OCA layer to bond directly to the first plurality of nanostructures (914). Suitable material includes TCTF (Transparent Conductive Transfer Film) by Hitachi, wherein the second substrate consists of a transparent, photocurable transfer film, which is applied to the first basic transparent conductor by a lamination process. The second basic transparent conductor (920) is further bonded, via a UV-blocking OCA layer (930), to a third substrate (932) such as a cover glass. An optional deco frame (940) may be incorporated underneath the cover lens (932).

Certain other features of the present disclosure are further discussed in more detail below.

Silver Nanostructures

As used herein, "silver nanostructures" generally refer to electrically conductive nano-sized structures, at least one dimension of which (i.e., width or diameter) is less than 500 nm; more typically, less than 100 nm or 50 nm. In various embodiments, the width or diameter of the nanostructures are in the range of 10 to 40 nm, 20 to 40 nm, 5 to 20 nm, 10 to 30 nm, 40 to 60 nm, or 50 to 70 nm.

The nanostructures can be of any shape or geometry. One way for defining the geometry of a given nanostructure is by its "aspect ratio," which refers to the ratio of the length and the width (or diameter) of the nanostructure. In certain embodiments, the nanostructures are isotropically shaped (i.e., aspect ratio=1). Typical isotropic or substantially isotropic nanostructures include nanoparticles. In preferred embodiments, the nanostructures are anisotropically shaped (i.e., aspect ratio≠1). The anisotropic nanostructure typically has a longitudinal axis along its length. Exemplary anisotropic nanostructures include nanowires (solid nanostructures having an aspect ratio of at least 10, and more typically, at least 50), nanorod (solid nanostructures having an aspect ratio of less than 10), and nanotubes (hollow nanostructures).

Lengthwise, anisotropic nanostructures (e.g., nanowires) are more than 500 nm, or more than 1 μm, or more than 10 μm in length. In various embodiments, the lengths of the nanostructures are in the range of 5 to 30 μm, or in the range of 15 to 50 μm, 25 to 75 μm, 30 to 60 μm, 40 to 80 μm, or 50 to 100 μm.

Typically, silver nanostructures have aspect ratios in the range of 10 to 100,000. Larger aspect ratios can be favored for obtaining a transparent conductor layer since they may enable more efficient conductive networks to be formed while permitting lower overall density of wires for a high transparency. In other words, when conductive nanowires with high aspect ratios are used, the density of the nanowires that achieves a conductive network can be low enough that the conductive network is substantially transparent.

Silver nanowires can be prepared by known methods in the art. In particular, silver nanowires can be synthesized through solution-phase reduction of a silver salt (e.g., silver nitrate) in the presence of a polyol (e.g., ethylene glycol) and poly(vinyl pyrrolidone). Large-scale production of silver nanowires of uniform size can be prepared and purified according to the methods described in U.S. Published Application Nos. 2008/0210052(410), 2011/0024159(427C1), 2011/0045272(428), and 2011/0048170(430), all in the name of Cambrios Technologies Corporation, the assignee of the present disclosure.

Nanostructure Layer

A nanostructure layer is a conductive network of networking metal nanostructures (e.g., silver nanowire) that provide the electrically conductive media of a transparent conductor. Since electrical conductivity is achieved by electrical charge percolating from one metal nanostructure to another, sufficient metal nanowires must be present in the conductive network to reach an electrical percolation threshold and become conductive. The surface conductivity of the conductive network is inversely proportional to its surface resistivity, sometimes referred to as sheet resistance, which can be measured by known methods in the art. As used herein, "electrically conductive" or simply "conductive" corresponds to a surface resistivity of no more than $10^4\Omega/\square$, or more typically, no more than $1,000\Omega/\square$, or more typically no more than $500\Omega/\square$, or more typically no more than $200\Omega/\square$. The surface resistivity depends on factors such as the aspect ratio, the degree of alignment, degree of agglomeration and the resistivity of the networking metal nanostructures.

In certain embodiments, the metal nanostructures may form a conductive network on a substrate without a binder. In other embodiments, a binder may be present that facilitates adhesion of the nanostructures to the substrate. Suitable binders include optically clear polymers including, without limitation: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g., polypropylene, polymethylpentene, and cyclic olefins), acrylonitrile-butadiene-styrene copolymer (ABS), cellulosics, silicones and other silicon-containing polymers (e.g., polysilsesquioxanes and polysilanes), polyvinylchloride (PVC), polyacetates, polynorbornenes, synthetic rubbers (e.g., EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

"Substrate" refers to a non-conductive material onto which the metal nanostructure is coated or laminated. The substrate can be rigid or flexible. The substrate can be clear or opaque. Suitable rigid substrates include, for example, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulfones such as polyethersulfone, polyimides, silicones and other conventional polymeric films. Additional examples of suitable substrates can be found in, e.g., U.S. Pat. No. 6,975,067.

Once a nanostructure layer is formed on a substrate, a basic transparent conductor is created. It can be further integrated with other functional layers/films to form an optical stack.

Typically, the optical transparence or clarity of the transparent conductor (i.e., a conductive network on a non-conductive substrate) can be quantitatively defined by parameters including light transmission and haze. "Light transmission" (or "light transmissivity") refers to the percentage of an incident light transmitted through a medium. In various embodiments, the light transmission of the conductive layer is at least 80% and can be as high as 98%. Performance-enhancing layers, such as an adhesive layer, anti-reflective layer, or anti-glare layer, may further contribute to reducing the overall light transmission of the transparent conductor. In various embodiments, the light transmission (T %) of the transparent conductors can be at least 50%, at least 60%, at least 70%, or at least 80% and may be as high as at least 91% to 92%, or at least 95%.

Haze (H %) is a measure of light scattering. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. Typically, haze of a conductive film can be significantly impacted by the diameters of the nanostructures. Nanostructures of larger diameters (e.g., thicker nanowires) are typically associated with a higher haze. In various embodiments, the haze of the transparent conductor is no more than 10%, no more than 8%, or no more than 5% and may be as low as no more than 2%, no more than 1%, or no more than 0.5%, or no more than 0.25%.

Coating Composition

The patterned transparent conductors according to the present disclosure are prepared by coating a nanostructure-containing coating composition on a non-conductive substrate. To form a coating composition, the metal nanowires are typically dispersed in a volatile liquid to facilitate the coating process. It is understood that, as used herein, any non-corrosive volatile liquid in which the metal nanowires can form a stable dispersion can be used. Preferably, the metal nanowires are dispersed in water, an alcohol, a ketone, ethers, hydrocarbons or an aromatic solvent (benzene, toluene, xylene, etc.). More preferably, the liquid is volatile, having a boiling point of no more than 200° C., no more than 150° C., or no more than 100° C.

In addition, the metal nanowire dispersion may contain additives and binders to control viscosity, corrosion, adhesion, and nanowire dispersion. Examples of suitable additives and binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont).

In one example, a nanowire dispersion, or "ink" includes, by weight, from 0.0025% to 0.1% surfactant (e.g., a preferred range is from 0.0025% to 0.05% for Zonyl® FSO- 100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl® FSN, Zonyl® FSO, Zonyl® FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, and hydroxy ethyl cellulose. Examples of suitable solvents include water and isopropanol.

The nanowire concentration in the dispersion can affect or determine parameters such as thickness, conductivity (including surface conductivity), optical transparency, and mechanical properties of the nanowire network layer. The percentage of the solvent can be adjusted to provide a desired concentration of the nanowires in the dispersion. In preferred embodiments the relative ratios of the other ingredients, however, can remain the same. In particular, the ratio of the surfactant to the viscosity modifier is preferably in the range of about 80 to about 0.01; the ratio of the viscosity modifier to the metal nanowires is preferably in the range of about 5 to about 0.000625; and the ratio of the metal nanowires to the surfactant is preferably in the range of about 560 to about 5. The ratios of components of the dispersion may be modified depending on the substrate and the method of application used. The preferred viscosity range for the nanowire dispersion is between about 1 and 100 cP.

Following the coating, the volatile liquid is removed by evaporation. The evaporation can be accelerated by heating (e.g., baking). The resulting nanowire network layer may require post-treatment to render it electrically conductive. This post-treatment can be a process step involving exposure to heat, plasma, corona discharge, UV-ozone, or pressure as described below.

Examples of suitable coating compositions are described in U.S. Published Application Nos. 2007/0074316(416), 2009/0283304(426), 2009/0223703(431), and 2012/0104374(436), all in the name of Cambrios Technologies Corporation, the assignee of the present disclosure.

The coating composition is coated on a substrate by, for example, sheet coating, web-coating, printing, and lamination, to provide a transparent conductor. Additional information for fabricating transparent conductors from conductive nanostructures is disclosed in, for example, U.S. Published Patent Application Nos. 2008/0143906(421) and 2007/0074316(416), in the name of Cambrios Technologies Corporation.

The transparent conductor structures, their electrical and optical properties, and the methods of patterning are illustrated in more detail by the following non-limiting examples.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g., Y. Sun, B. Gates, B. Mayers, & Y. Xia, "Crystalline silver nanowires by soft solution processing", Nanoletters, (2002), 2(2) 165-168. A modified polyol method, described in U.S. Published Application Nos. 2008/0210052(410) and 2011/0174190(433), in the name of Cambrios Technologies Corporation, produces more uniform silver nanowires at higher yields than does the conventional "polyol" method. These applications are incorporated by reference herein in its entirety.

Example 2

Standard Film-Fabrication Procedures

An ink composition was prepared that comprised silver nanowires, a cellulose based binder, and a surfactant (e.g., a fluorosurfactant such as ZONYL® FSA). The ink was slot-die, roll-to-roll coated on a PET film (e.g., MFLINEX-454 or TORAY U483) and was allowed to dry to form a nanowire layer. For certain embodiments, a polymeric overcoat was then applied on the nanowire layer.

The roll-to-roll process can accommodate a variety of substrate and film dimensions. Suitable roll-to-roll deposition processes can include, but are not limited to, slot die, gravure, reverse gravure, micro-gravure, reverse roll and Mayer-bar. More detailed description of the roll-to-roll process can be found in U.S. Pat. No. 8,049,333(416) and U.S. Published Patent Application No. 2013/0040106(444), in the name of Cambrios Technologies Corporation, the assignee of the present application. Both of these patent documents are incorporated herein by reference in their entireties.

Example 3

Light Stability of Films with and without UV-Blocking Layer

Figure 14A:
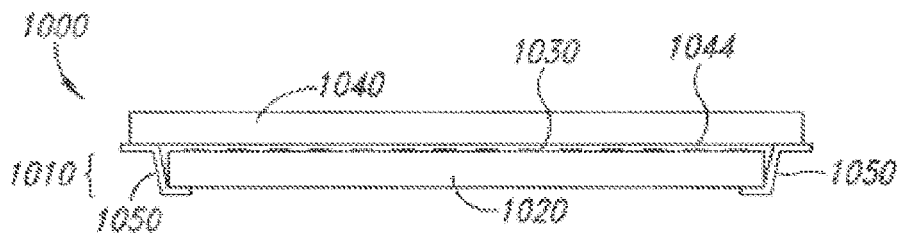
FIGS. 14A and 14B show examples of incorporating a UV-blocking layer in an optical stack.

A sample optical stack (1000) without a UV-blocking layer is shown in FIG. 14A. A basic transparent conductive film (1010) having a PET substrate (1020) and a networking layer of silver nanowires (1030) was first made according to Example 2. The basic transparent conductive film was then mounted on a piece of Eagle XG glass (1040) and secured with tapes (1050) around the edges. The nanowires (1030) face the glass (1040) and are loosely in contact with it, but not bonded to it with any adhesive. An air gap (1044) is schematically shown to illustrate this configuration.

Figure 14B:
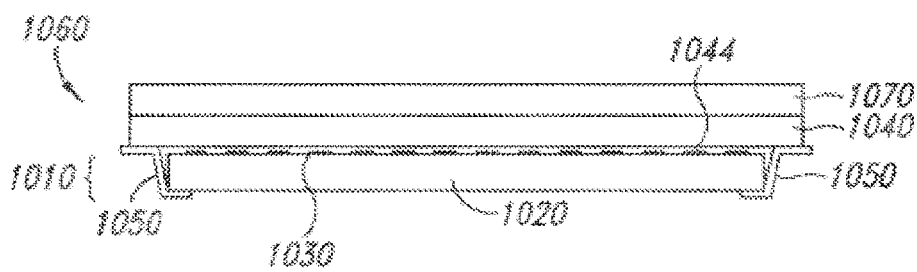

Another sample optical stack (1060) with a UV-blocking layer is shown in FIG. 14B and can be made from the optical stack (1000) of FIG. 14A by laminating a UV-blocking film (1070) on the surface of the glass opposite from the nanowires.

Figure 14C:
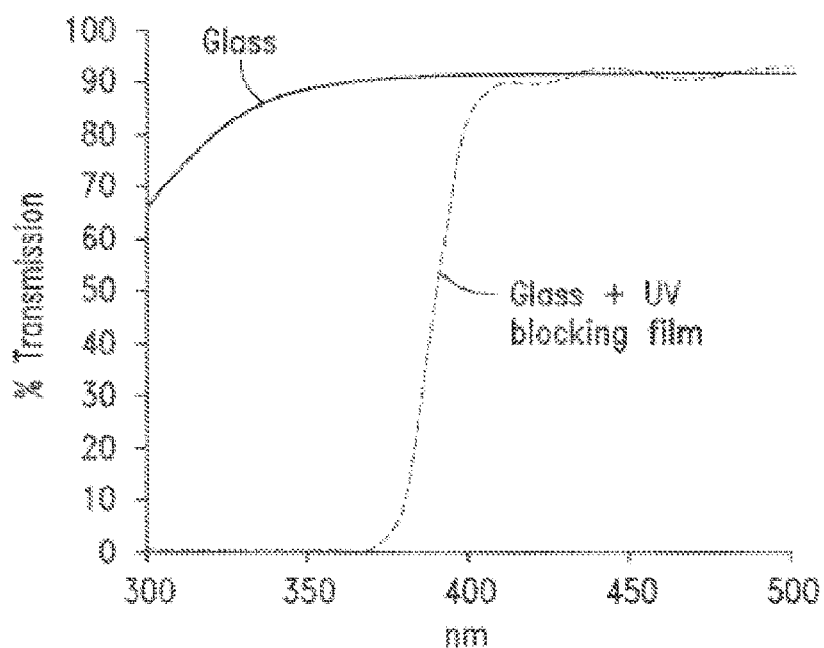
FIG. 14C shows the light transmissions of glass as compared to glass laminated with an UV-blocking film.

FIG. 14C shows the transmission spectrum of bare Eagle XG glass, as compared to that of the glass laminated with the UV-blocking film. As shown, while the glass allows up to 90% of the UV light (below 370 nm) to transmit through, the glass with the UV-blocking layer blocks nearly all light below 370 nm (near zero transmission).

The sheet resistance of each film was measured with a Delcom 717 non-contact resistance meter. The average sheet resistance was about 130 ohms/square.

The samples were placed in an Atlas XXL+ Xenon Weatherometer, with an Atlas 'daylight' filter. They were oriented such that the glass was between the film and the light source. The light intensity was set to 0.8 W/m2*nm at 420 nm, and the light spectrum and intensity closely match direct sunlight. The environmental conditions were set at:

38° C. chamber temperature,
60° C. black panel temperature, and
50% relative humidity.

The samples were removed periodically and the electrical measurements were measured.

Figure 14D:
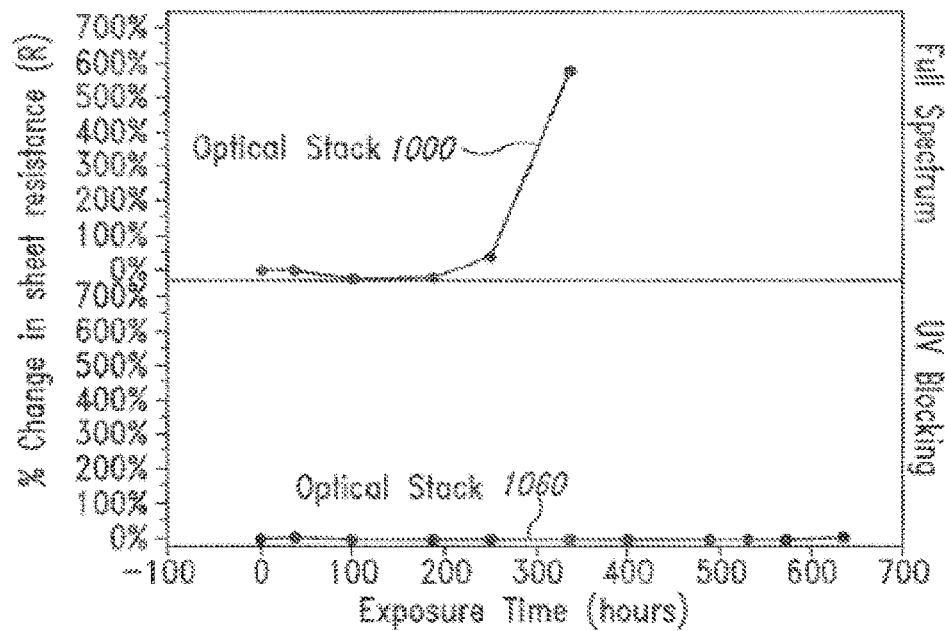
FIG. 14D shows the time evolution of the sheet resistance for the two optical stack (1000 vs. 1060) under light exposure.

FIG. 14D shows the time evolution of the sheet resistance for the two samples (optical stack 1000 vs. 1060). It can be seen that the sheet resistance increases much more slowly when the UV portion of the incident light is blocked.

Example 4

Light Stability of Laminated Films with an UV-Blocking Layer

Basic transparent conductive films were prepared according to Example 2. The average sheet resistance of the film was 130 ohms/sq. Pieces of the film were laminated to pieces of Eagle XG glass with an OCA layer (3M 8146-2), with the nanowire layer contacting the OCA and facing the glass. A UV-blocking film was applied to the opposite surface of the glass for some samples. Black electrical tape was applied to the surface of the glass opposite the nanowire layer for all samples, such that half of the sample was covered with black tape. The sample configuration is the same as the embodiment shown in FIG. 3.

The sample dimensions were 2"×3". Sheet resistance measurements were made using a Delcom 717 non-contact sheet resistance meter at the following three positions: in the centers of the dark and light regions, and at the light/dark interface (i.e., "edge," although this is not the physical edge of the sample). The Delcom measures sheet resistance using eddy currents, and the sensing radius is approximately 1 cm.

Figure 15:
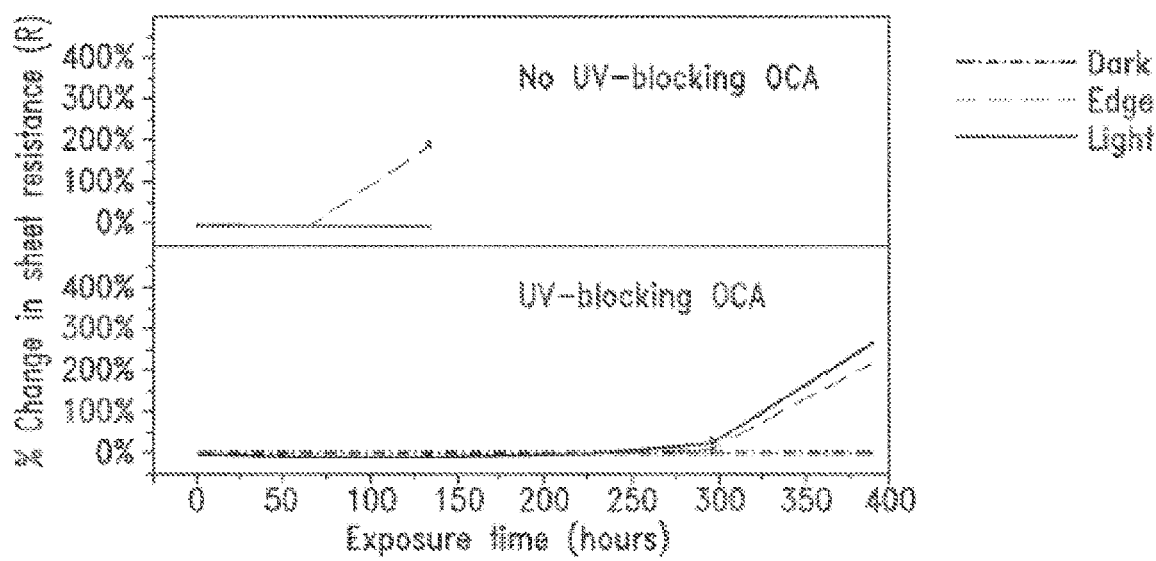
FIG. 15 shows the comparative results of sheet resistance changes under high-intensity light for optical stacks with and without a UV-blocking film.

The samples were placed glass-side-up in the Xenon chamber described in Example 3, with the same test conditions. The samples were removed at various times and the electrical measurements were repeated. The data are shown in FIG. 15. For the sample without the UV-blocking layer, the sheet resistance signal increases sharply at the edge position sometime between 75 and 150 hours, while the sheet resistance in the dark and light regions has not increased.

For the sample with the UV-blocking film, no appreciable change in the sheet resistance is observed until approximately 300 hours of light exposure. Beyond 300 hours, the sheet resistance increases uniformly in the illuminated region, rather than specifically at the light dark interface. Thus, blocking the UV portion of the spectrum leads to an increase in the sample lifetime, as well as a change in the failure mode.

Thus, the net effect of blocking the UV portion of the light is shown to increase the duration of light exposure before appreciable resistance increase occurs in any portion of the sample.

Example 5

Light Stability of Films with an UV-Blocking Layer Under Simulated Sunlight of Reduced Intensity Samples of basic transparent conductive films substantially identical to those described in Example 2 were prepared. The samples were placed in a metal baking pan with raised edges, with the glass side facing upwards. The pan was then covered with three layers of wire mesh screen, having mesh counts of 60, 100, and 325 wires per inch. The combined transmission of the three layers of screens was approximately 5% and substantially independent of wavelengths above 300 nm, as measured with a spectrophotometer. The screens were clamped to the edges of the baking pan to prevent stray light from entering.

The pan was placed in the Xenon chamber under the same conditions as in Examples 3 and 4, and the samples were removed periodically for electrical characterization. Although the light source in the Xenon chamber was the same as Examples 3 and 4, the wire meshes reduced the light intensity that was incident on the samples.

Figure 16:
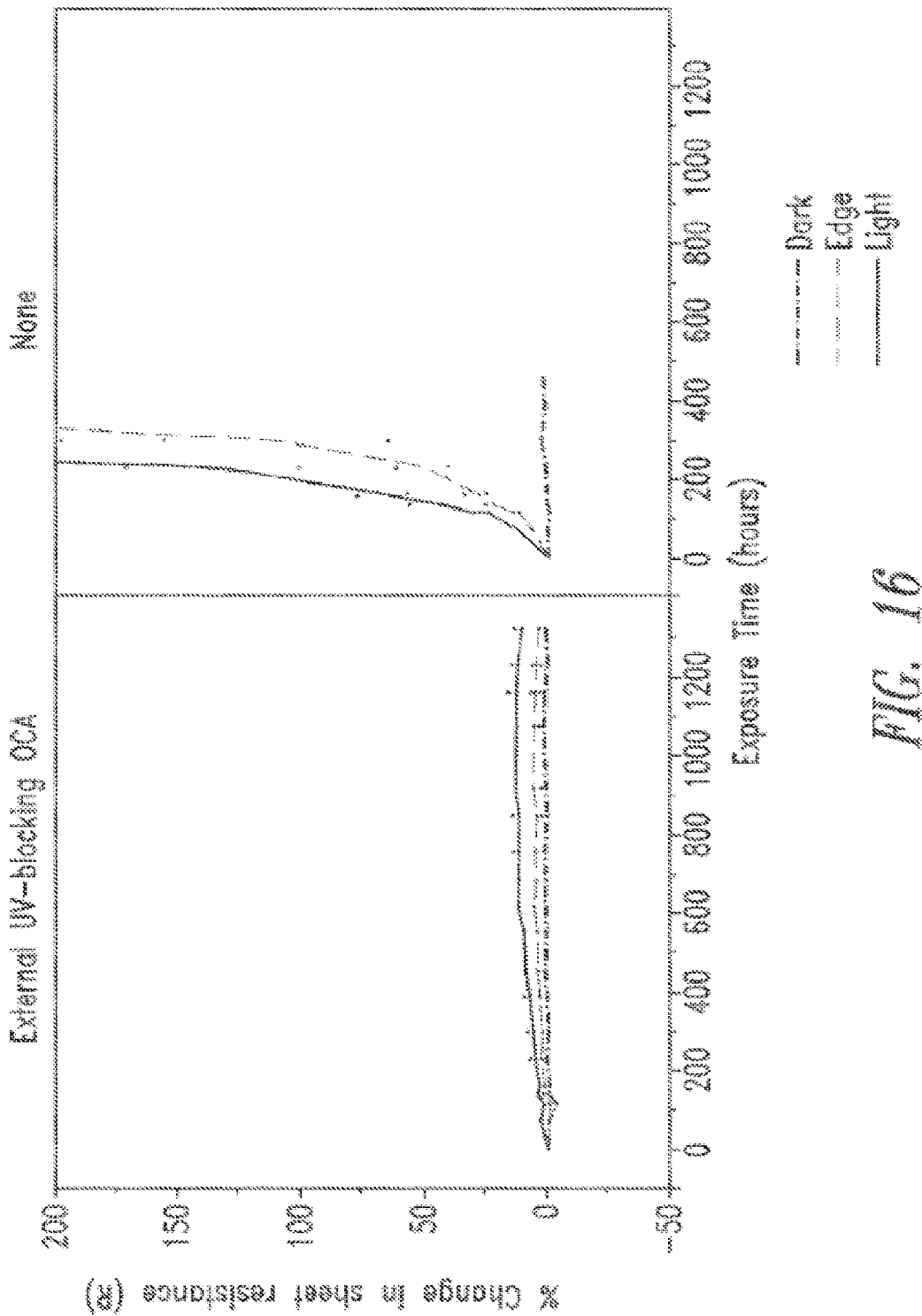
FIG. 16 shows the comparative results of sheet resistance changes under low-intensity light for optical stacks with and without a UV-blocking film.

The results are shown in FIG. 16. The sheet resistance of the control sample (no UV-blocking layer) increases steadily, and by 100% within about 200 hours. In contrast, to the results of Example 2 (which shows the "edge failure"), the resistance increase at the edge lags behind the stronger, increase in the illuminated region. Surprisingly, even though the light intensity has been reduced by a factor of 20, the time scale for failure is not appreciably different. This is believed to be a result of the photooxidation reaction being limited primarily by oxygen diffusion, not light intensity, in full strength Xenon exposure.

In contrast, the sample with the UV-blocking layer is stable for at least 1300 hours.

Example 6

Light Stability of Films Exposed to Indirect Light Through a Window

Figure 17A:
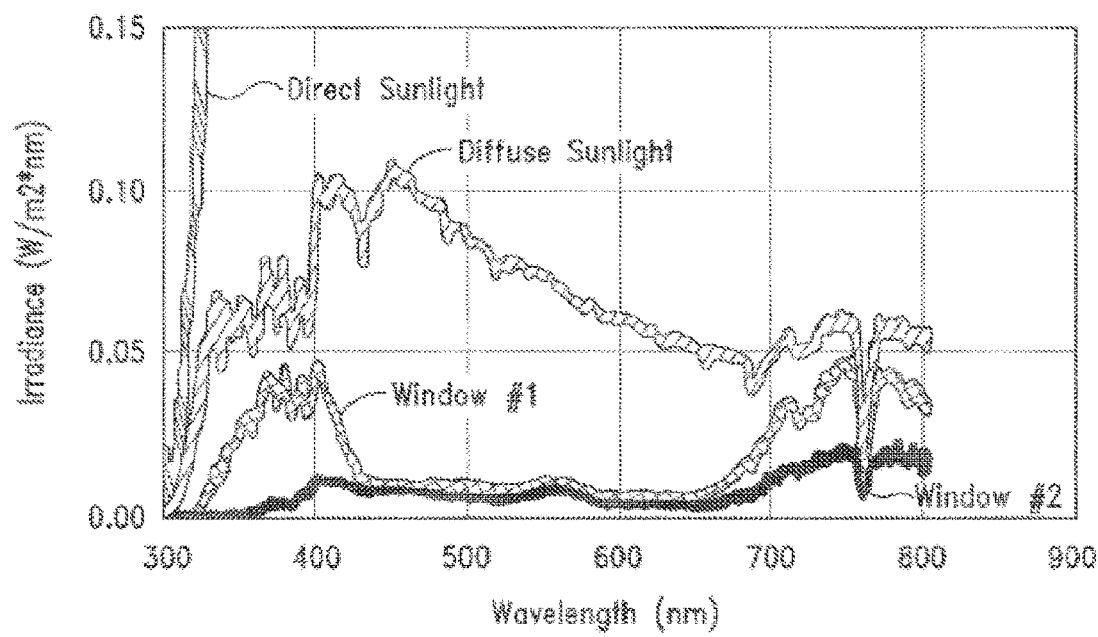
FIG. 17A shows the light irradiance spectra of certain lighting conditions.

Samples with similar structure as in the previous examples were prepared and placed next to two different north facing windows in an office building. The windows were tinted gray to a similar degree, but also differed in their UV transmission. Irradiance spectra were taken at both windows using an Atlas LS200 calibrated spectraradiometer within a few minutes of each other at 11 a.m., and are shown in FIG. 17A. Also shown for reference are spectra acquired by pointing the spectraradiometer at the blue sky (no direct sunlight, diffuse sunlight only) and directly at the sun. Both were taken outdoors on a sunny day at the same time. It can be seen that Window #2 transmits about 10 times less UV light than Window #1.

Figure 17B:
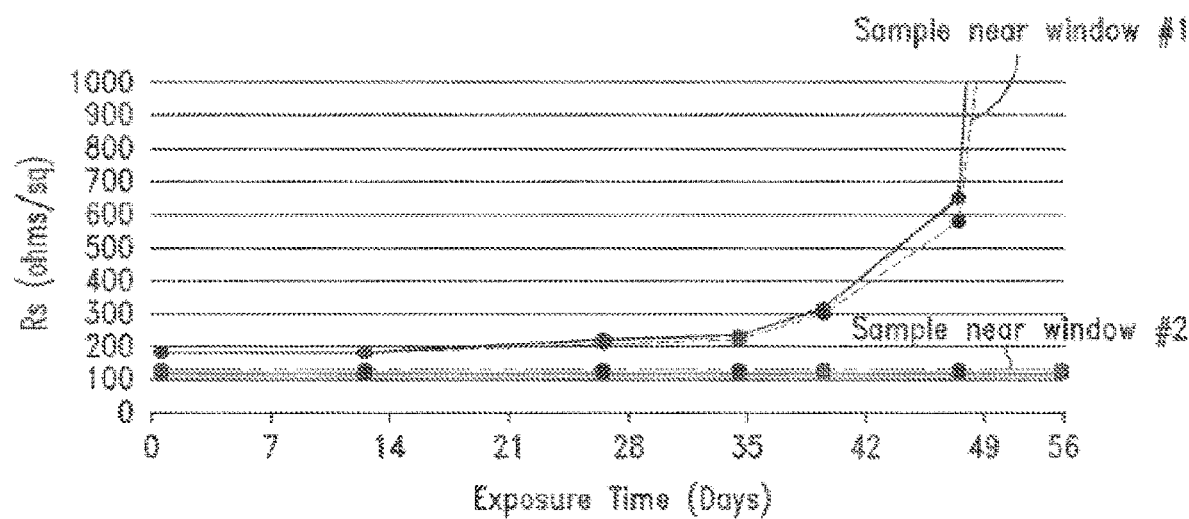
FIG. 17B shows the sheet resistance changes in optical stacks without UV-blocking films under certain lighting conditions.

The resistance data for the samples (without internal UV-blocking layers) next to the two windows are shown in FIG. 17B. The sample behind the window with lower UV transmission is much more stable, again confirming the benefits of UV blocking.

Example 7

Incorporation of a UV-Blocking Layer into an Optical Stack

Figures 18A, 18B:
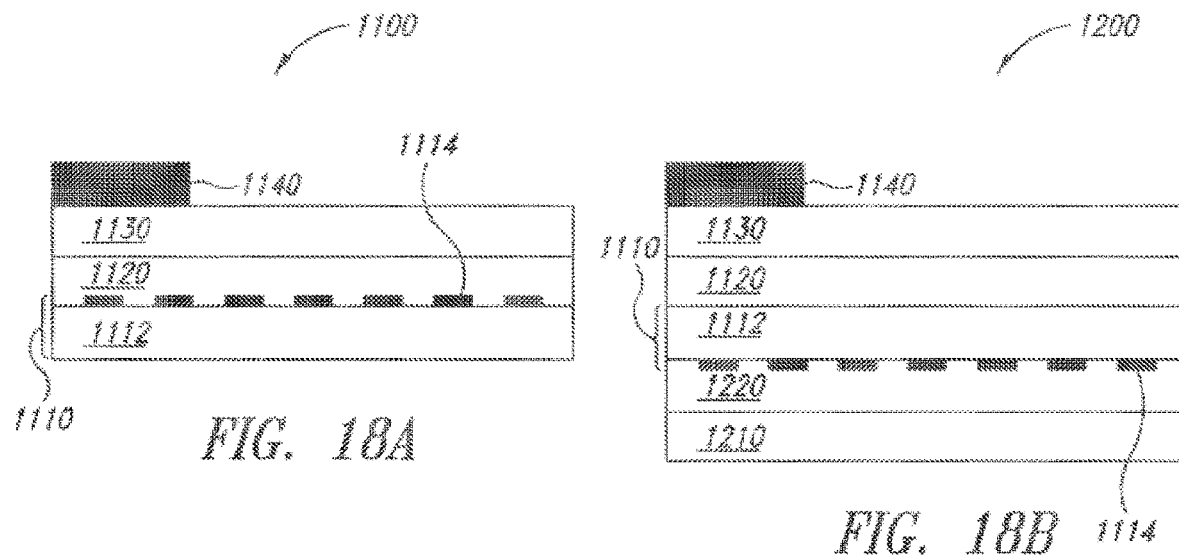
FIGS. 18A, 18B and 18C show examples of multi-layer optical stacks incorporating a UV-blocking layer, and their respective sheet resistance changes upon light exposure.

A UV-blocking layer may be directly incorporated into the optical film stack of a touch sensor structure, without the need to apply UV-blocking coatings or films to the glass cover lens. Samples were prepared with the structures shown in FIGS. 18A and 18B, FIG. 18A illustrates the construction of an optical stack (1100). More specifically, a basic transparent conductive film (1110) is shown to bond, via a UV-blocking OCA layer (1120), to a glass cover (1130). The basic transparent conductive film (1110) includes a substrate (1112) and a plurality of networking silver nanowires (1114). The substrate (1112) may be a PET film. The UV-blocking OCA layer is 3M 8172PCL and is in direct contact with the silver nanowires (1114). In FIG. 18A, a black-out mask (1140) is shown on the periphery of the optical stack (1100) to model the dark/light interface.

In the event in which chemicals in certain UV-blocking OCA layers interact with the silver nanowires or otherwise are incompatible with the silver nanowires, it is preferred that the UV-blocking OCA layer and the silver nanowires do not come into direct contact with each other. Thus, in an alternative configuration, an intervening layer is incorporated between the UV-blocking layer and the silver nanowires. FIG. 18B shows that the intervening layer could be the substrate of a basic transparent conductive film (e.g., and ClearOhm film).

More specifically, in FIG. 18B, an optical stack (1200) is constructed by bonding a first substrate (1210), via a first OCA layer (1220), to a basic transparent conductive film (1110), which includes a second substrate (1112) and a plurality of networking silver nanowires (1114). The first OCA layer (1220) does not need to block UV light, but is selected to be chemically compatible with the silver nanowires (1114) such that a direct contact with the silver nanowires does not destabilize them. An example of the first OCA layer is 3M 8146. Alternatively, the first OCA layer can be an Optically Clear Resin (OCR) layer, including any OCR layers known in the art for directly bonding of touch sensors to displays. The first substrate (1210) and the second substrate (1112) may be PET films. In alternative embodiments, the first substrate can also comprise the display.

The basic transparent conductive film (1110) is then bonded, via a UV-blocking OCA layer (1120), to a glass cover (1130). Unlike FIG. 18A, FIG. 18B shows that the basic transparent conductive film (1110) contacts the UV-blocking OCA layer (1120) by its substrate (1120), thus avoiding a direct contact between the silver nanowires (1114) and the UV-blocking OCA layer. An example of the UV-blocking layer is 3M 8172PCL. In FIG. 18B, a black-out mask (1140) is shown on the periphery of the optical stack (1200) to model the dark/light interface.

In both of these configuration, a UV-blocking OCA layer (1120) is employed, which serves the dual functions of bonding and blocking the UV region of the light spectrum incident on the optical stack. These configurations obviate any need to separately apply a UV-blocking coating. However, an additional UV-blocking coating on, for example, the glass cover, is also contemplated.

Figure 18C:
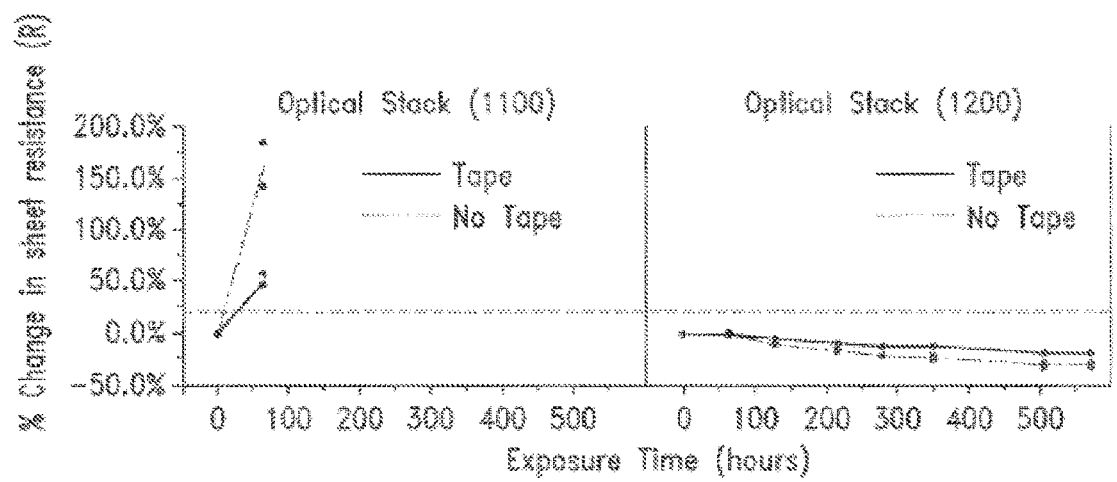

The optical stacks were tested for light stability in the same manner as in Example 3. In this example, sheet resistance data were collected only at the light exposed and light/dark interface positions. FIG. 18C shows the changes in sheet resistance for optical stack (1100) and optical stack (1200). Optical stack (1100) shows poor light stability, most likely due to the destabilization or deterioration of the silver nanowires induced by the incompatibility between the silver nanowires and the UV-blocking OCA layer.

Optical stack (1200), on the other hand, shows light stability over a period of 500 hours of light exposure. This result indicates that by avoiding direct contact between the incompatible UV-blocking OCA and the silver nanowires, the UV-blocking OCA layer is capable of stabilizing the performance of the optical stack by blocking the UV light.

All of the above U.S. patents, U.S. patent application publications, U.S. patent applications, foreign patents, foreign patent applications and non-patent publications referred to in this specification and/or listed in the Application Data Sheet, including but not limited to [insert list], are incorporated herein by reference, in their entirety.

From the foregoing it will be appreciated that, although specific embodiments of the invention have been described herein for purposes of illustration, various modifications may be made without deviating from the spirit and scope of the invention.

The invention claimed is:

1. A touch sensor, comprising:
   a first transparent conductor comprising a first substrate and a first plurality of networking silver nanostructures;
   a first optically clear adhesive (OCA) layer; and
   a second substrate, wherein:
   the first OCA layer is UV-blocking and is positioned between the first transparent conductor and the second substrate.

2. The touch sensor of claim 1, comprising:
   a second OCA layer; and
   a third substrate, wherein:
   the second OCA layer is positioned between the third substrate and the first transparent conductor.

3. The touch sensor of claim 2, wherein the first plurality of networking silver nanostructures is positioned between the second OCA layer and the first substrate.

4. The touch sensor of claim 1, wherein the first substrate is positioned between the first plurality of networking silver nanostructures and the first OCA layer.

5. The touch sensor of claim 1, comprising:
   a light-absorbing element, wherein the second substrate is positioned between the first OCA layer and the light-absorbing element.

6. The touch sensor of claim 1, wherein the first plurality of networking silver nanostructures is positioned between the first substrate and the first OCA layer.

7. The touch sensor of claim 1, comprising:
   a second transparent conductor comprising the second substrate and a conductive layer.

8. The touch sensor of claim 7, wherein the conductive layer is a continuous conductive film.

9. The touch sensor of claim 7, wherein the conductive layer comprises indium tin oxide.

10. The touch sensor of claim 7, wherein the conductive layer is positioned between the first OCA layer and the second substrate.

11. The touch sensor of claim 1, comprising:
    a light-absorbing element, wherein the light-absorbing element is positioned between the first transparent conductor and the second substrate.

12. The touch sensor of claim 1, wherein the first OCA layer is configured to block at least 90% of wavelengths below 370 nm.

13. The touch sensor of claim 1, wherein the first OCA layer is configured to cause a sheet resistance of the first plurality of networking silver nanostructures to change by less than 50% after being exposed to a ultra-violet (UV) portion of incident light for 600 hours.

14. A touch sensor having a visible region and a non-visible region, wherein the non-visible region is defined by a light-absorbing element, the touch sensor comprising:
    a first plurality of networking silver nanostructures present in the visible region and in the non-visible region;
    a first optically clear adhesive (OCA) layer present in the visible region and in the non-visible region; and
    a first substrate, wherein:
    the first OCA layer is UV-blocking and is positioned between the first plurality of networking silver nanostructures and the first substrate.

15. The touch sensor of claim 14, wherein the first substrate is positioned between the first OCA layer and the light-absorbing element.

16. The touch sensor of claim 14, wherein the light-absorbing element is at least one of a deco frame or a black-out mask.

17. The touch sensor of claim 14, comprising:
    a second substrate, wherein the second substrate is positioned between the first plurality of networking silver nanostructures and the first OCA layer.

18. The touch sensor of claim 14, wherein the light-absorbing element is positioned between the first plurality of networking silver nanostructures and the first substrate.

19. A touch sensor, comprising:
a first transparent conductor comprising a first substrate and a first plurality of networking silver nanostructures; and
a first optically clear adhesive (OCA) layer over the first transparent conductor, wherein:
  the first OCA layer is UV-blocking, and
  the first OCA layer is positioned between a touch surface of the touch sensor and the first plurality of networking silver nanostructures.

20. The touch sensor of claim 19, comprising:
a light-absorbing element over a first portion of the first OCA layer and not over a second portion of the first OCA layer.

* * * * *